United States Patent
Zhu et al.

(10) Patent No.: US 9,041,029 B2
(45) Date of Patent: *May 26, 2015

(54) LIGHT EMITTING DIODE

(75) Inventors: Zhen-Dong Zhu, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 603 days.

This patent is subject to a terminal disclaimer.

(21) Appl. No.: 13/340,627

(22) Filed: Dec. 29, 2011

(65) Prior Publication Data

US 2013/0087818 A1    Apr. 11, 2013

(30) Foreign Application Priority Data

Oct. 7, 2011    (CN) .......................... 2011 1 0293095

(51) Int. Cl.
*H01L 33/22*    (2010.01)
*H01L 33/44*    (2010.01)
*B82Y 20/00*    (2011.01)
*H01L 33/00*    (2010.01)

(52) U.S. Cl.
CPC ............... *B82Y 20/00* (2013.01); *H01L 33/22* (2013.01); *H01L 33/0095* (2013.01)

(58) Field of Classification Search
CPC . H01L 33/22; H01L 21/0276; H01L 31/0236; H01L 31/02363; H01L 31/02366; G02B 5/0215
See application file for complete search history.

(56) References Cited

U.S. PATENT DOCUMENTS

| | | | |
|---|---|---|---|
| 8,008,683 B2 | 8/2011 | Choi et al. | |
| 8,430,539 B2 | 4/2013 | Matsuzaki et al. | |
| 8,624,285 B2 * | 1/2014 | Zhu et al. | 257/98 |
| 8,629,424 B2 * | 1/2014 | Zhu et al. | 257/13 |
| 8,759,857 B2 * | 6/2014 | Zhu et al. | 257/98 |
| 8,759,858 B2 * | 6/2014 | Zhu et al. | 257/98 |
| 8,785,955 B2 * | 7/2014 | Zhu et al. | 257/98 |
| 8,796,716 B2 * | 8/2014 | Zhu et al. | 257/98 |
| 2006/0038190 A1 * | 2/2006 | Park et al. | 257/95 |
| 2007/0262330 A1 | 11/2007 | Lee et al. | |
| 2008/0230793 A1 | 9/2008 | Yoon et al. | |
| 2008/0296598 A1 | 12/2008 | Wang et al. | |

(Continued)

FOREIGN PATENT DOCUMENTS

| | | |
|---|---|---|
| CN | 101999178 | 3/2011 |
| CN | 102066990 | 5/2011 |
| JP | 2007-529893 | 10/2007 |
| JP | 2007-311784 | 11/2007 |
| JP | 2009-526397 | 7/2009 |
| JP | 2010-87057 | 4/2010 |
| JP | 2011-187658 | 9/2011 |
| JP | 2011-192880 | 9/2011 |
| JP | 2012-33520 | 2/2012 |
| TW | 200847475 | 12/2008 |
| TW | 201006002 | 2/2010 |
| TW | 201034246 | 9/2010 |
| WO | WO2010030053 | 3/2010 |

*Primary Examiner* — Shaun Campbell
*Assistant Examiner* — Raj R Gupta
(74) *Attorney, Agent, or Firm* — Novak Druce Connolly Bove + Quigg LLP

(57) ABSTRACT

A light emitting diode including a substrate, a first semiconductor layer, an active layer, and a second semiconductor layer is provided. The substrate includes a first surface and a second surface, and the second surface is a light emitting surface of the LED. The first semiconductor layer, the active layer, and the second semiconductor layer are stacked on the first surface in that order. A first electrode electrically is connected with the first semiconductor layer. A second electrode is electrically connected with the second semiconductor layer. A number of three-dimensional nano-structures are located on at least one surface of the substrate and aligned side by side, and a cross section of each of the three-dimensional nano-structure is M-shaped.

19 Claims, 12 Drawing Sheets

(56) References Cited

U.S. PATENT DOCUMENTS

| | | |
|---|---|---|
| 2010/0059789 A1 | 3/2010 | Choi |
| 2011/0215290 A1 | 9/2011 | Choi et al. |
| 2011/0215370 A1 | 9/2011 | Sato et al. |
| 2013/0087818 A1* | 4/2013 | Zhu et al. ............... 257/98 |
| 2013/0087819 A1* | 4/2013 | Zhu et al. ............... 257/98 |
| 2013/0087820 A1* | 4/2013 | Zhu et al. ............... 257/98 |
| 2013/0089709 A1* | 4/2013 | Zhu et al. ............. 428/167 |

* cited by examiner

LIGHT EMITTING DIODE

CROSS-REFERENCE TO RELATED APPLICATIONS

This application claims all benefits accruing under 35 U.S.C. §119 from China Patent Application No. 201114293096.1, filed on Oct. 7, 2011 in the China Intellectual Property Office, disclosure of which is incorporated herein by reference. This application is related to applications entitled, "METHOD FOR MAKING LIGHT EMITTING DIODE", U.S. Ser. No. 13/340,653, filed Dec. 29, 2011; "METHOD FOR MAKING LIGHT EMITTING DIODE", U.S. Ser. No. 13/340,658, filed Dec. 29, 2011; "LIGHT EMITTING DIODE", U.S. Ser. No. 13/340,661, filed Dec. 29, 2011; "METHOD FOR MAKING LIGHT EMITTING DIODE", U.S. Ser. No. 13/340,662, filed Dec. 29, 2011; "LIGHT EMITTING DIODE", U.S. Ser. No. 13/340,643, filed Dec. 29, 2011.

BACKGROUND

1. Technical Field

The present disclosure relates to a light emitting diode (LED) and the method for making the same.

2. Description of the Related Art

LEDs are semiconductors that convert electrical energy into light. Compared to conventional light sources, the LEDs have higher energy conversion efficiency, higher radiance (i.e., they emit a larger quantity of light per unit area), longer lifetime, higher response speed, and better reliability. At the same time, LEDs generate less heat. Therefore, LED modules are widely used as light sources in optical imaging systems, such as displays, projectors, and so on.

A conventional LED commonly includes an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and photons in the N-type semiconductor layer can enter the active layer and combine with each other to emit visible light.

However, extraction efficiency of LEDs is low because typical semiconductor materials have a higher refraction index than that of air. Large-angle light emitted from the active layer may be internally reflected in LEDs, so that a large portion of the light emitted from the active layer will remain in the LEDs, thereby degrading the extraction efficiency.

What is needed, therefore, is a light emitting diode and a method for making the same, which can overcome the above-described shortcomings

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
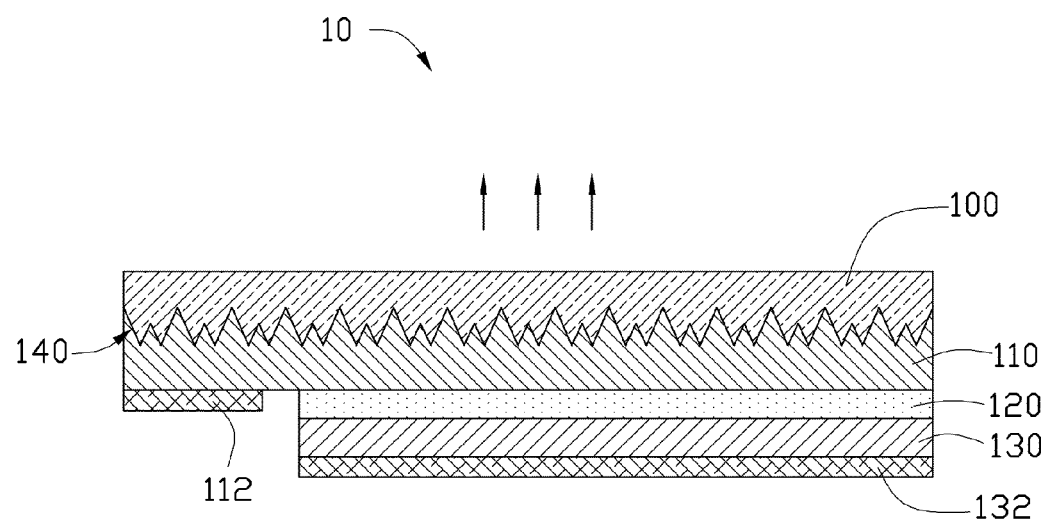
FIG. 1 shows a schematic view of one embodiment of an LED.

Referring to FIG. 1, an LED 10 includes a substrate 100, a first semiconductor layer 110, an active layer 120 and a second semiconductor layer 130, a first electrode 112, a second electrode 132 and a three-dimensional nano-structure array 140. The substrate 100 includes a first surface and the second surface opposite to the first surface. The first semiconductor layer 110, the active layer 120 and the second semiconductor layer 130 are stacked on the first surface of the substrate 100 in that order, and the first semiconductor layer 110 is contacted with the substrate 100. The second surface is used as the light emitting surface of the LED 10. The first electrode 112 is electrically connected with the first semiconductor layer 110, and the second electrode 132 is electrically connected with the second semiconductor layer 130. The three-dimensional nano-structure array 140 is formed on the first surface of the substrate 100.

The substrate 100 can be made of a transparent material and adapted to support the first semiconductor layer 110. A shape or a size of the substrate 100 is determined according to need. The substrate 100 includes an epitaxial growth surface 101 which is used to grow the first semiconductor layer 110. The epitaxial growth surface 101 is a clean and smooth surface. The substrate 100 can be a single-layer structure or a multi-layer structure. If the substrate 100 is a single-layer structure, the substrate 100 can be a single crystal structure having a crystal face used as the epitaxial growth surface 101. If the substrate 100 is a multi-layer structure, the substrate 100 should include at least one layer having the crystal face. The material of the substrate 100 can be GaAs, GaN, AlN, Si, SOL SiC, MgO, ZnO, LiGaO2, LiAlO2, or Al2O3. The material of the substrate 100 can be selected according to the material of the first semiconductor layer 110. The first semiconductor layer 110 and the substrate 100 should have a small crystal lattice mismatch and a thermal expansion mismatch. The size, thickness, and shape of the substrate 100 can be selected according to need. In one embodiment, the substrate 100 is a sapphire substrate with a thickness of about 40 nm.

Figure 2:
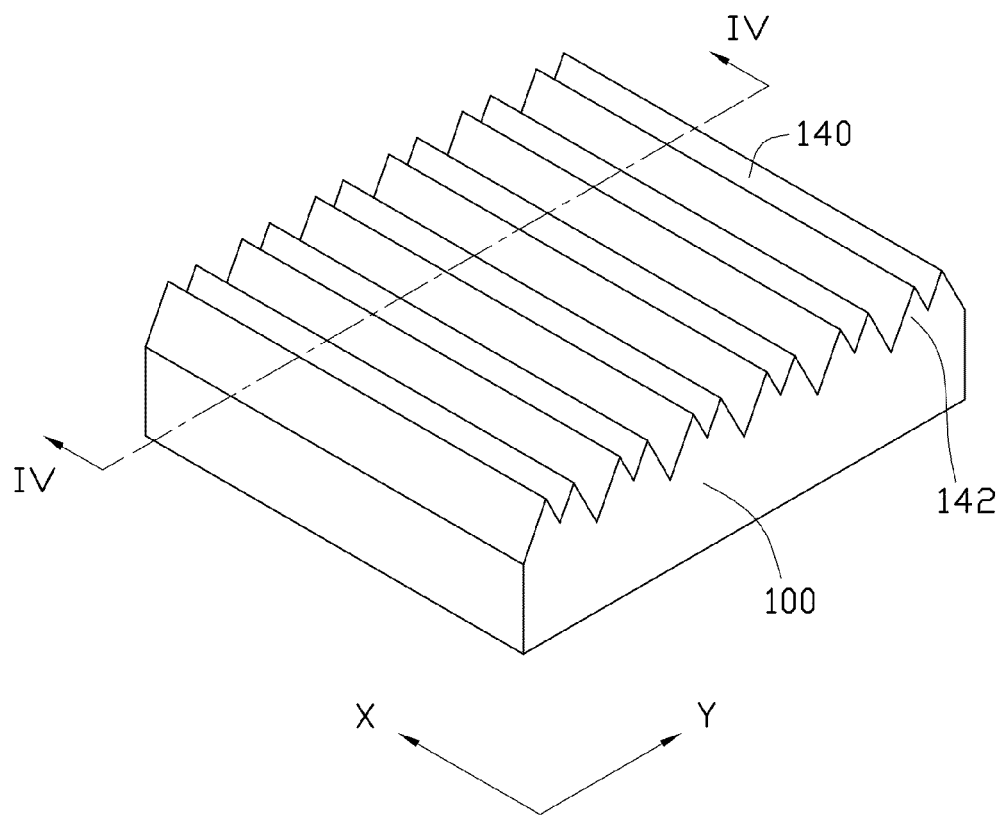
FIG. 2 is an isometric view of one embodiment of a three-dimensional nano-structures array in the LED of FIG. 1.
Figure 3:
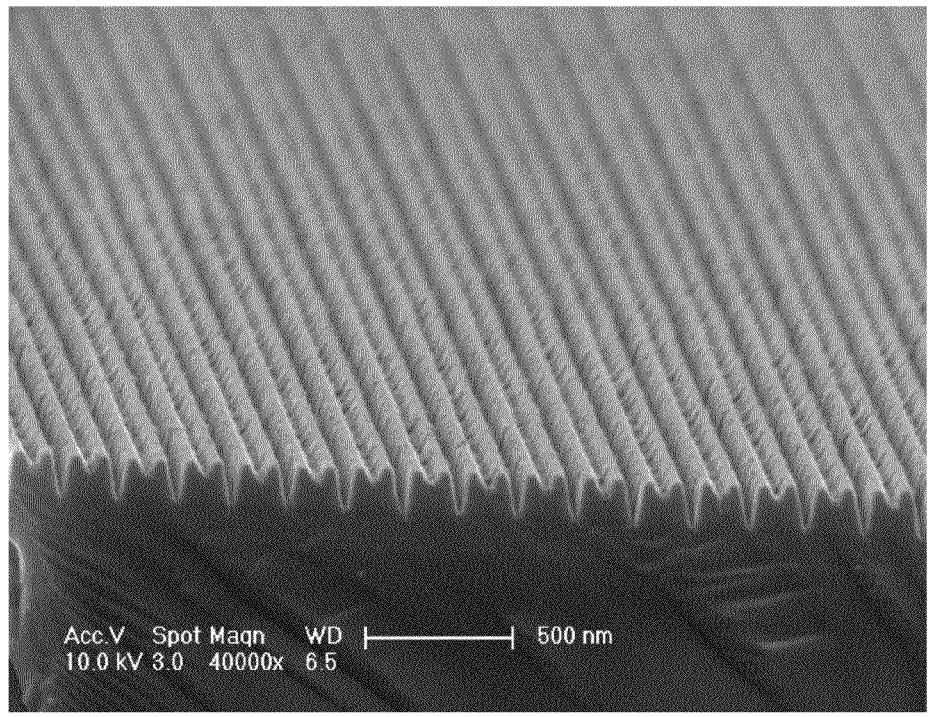
FIG. 3 shows a Scanning Electron Microscope (SEM) image of the three-dimensional nano-structures array of FIG. 2.

Referring to FIG. 2 and FIG. 3, one embodiment of the three-dimensional nano-structure 142 can be a protruding structure. The protruding structure protrudes out from the surface of the substrate 100. The material of the three-dimensional nano-structures 142 can be the same as or different from the material of the substrate 100. The three-dimensional nano-structure 142 can be attached on the surface of the substrate 100, and the three-dimensional nano-structure 142 can also be integrated with the substrate 100 to form an integrated structure. The plurality of three-dimensional nano-structures 142 is a protruding structure located on the surface of the substrate 100.

The plurality of three-dimensional nano-structures 142 can be arranged side by side. Each of the three-dimensional nano-structures 142 can extend along a straight line, a curvy line or a polygonal line. The extending direction is substantially parallel with the surface of the substrate 100. The two adjacent three-dimensional nano-structures are arranged with a certain interval. The distance ranges from about 0 nanometers to about 200 nanometers. The extending direction of the three-dimensional nano-structure 142 can be fixed or varied. While the extending direction of the three-dimensional nano-structure 142 is fixed, the plurality of three-dimensional nano-structures 142 extends along a straight line, otherwise the three-dimensional nano-structures 142 extends along a polygonal line or a curvy line. The cross-sectional of the three-dimensional nano-structure 142 along the extending direction, is an "M" with the same area. Referring to FIG. 3, the three-dimensional nano-structures 142 are a plurality of bar-shaped protruding structures extending along a straight line and spaced from each other. The plurality of three-dimensional nano-structures 142 are substantially parallel with each other and extend along the same direction to form an array. The plurality of three-dimensional nano-structures 142 are substantially uniformly and equidistantly distributed on the entire surface of the substrate 100.

Figure 4:
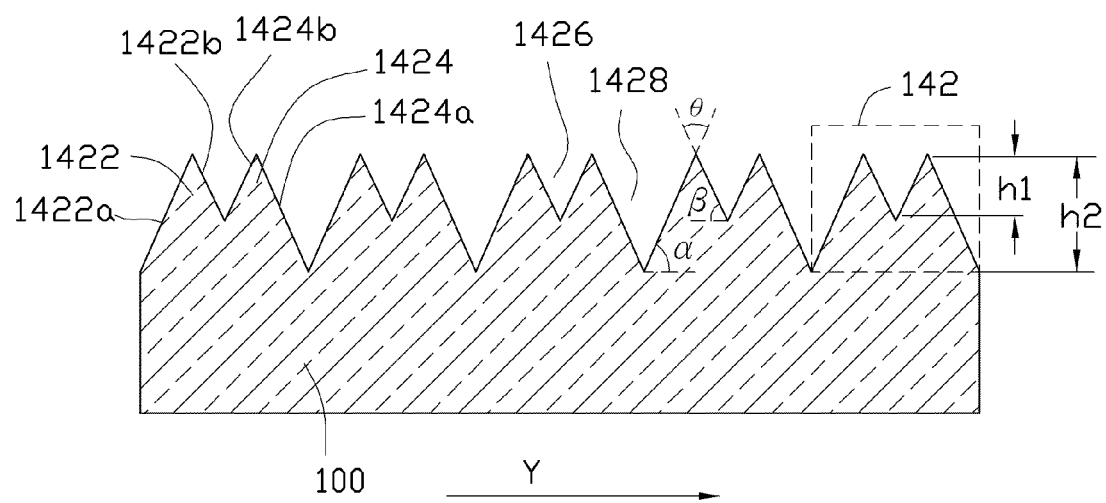
FIG. 4 shows cross-section view along a line IV-IV of FIG. 2.

Referring to FIG. 4, the extending direction of the three-dimensional nano-structure 142 is defined as the X direction, and the Y direction is substantially perpendicular to the X direction and substantially parallel with the surface of the substrate 100. The three-dimensional nano-structure 142 extends from one side of the substrate 100 to the opposite side along the X direction. The three-dimensional nano-structure 142 is a double-peak structure including two peaks. The cross-section of the double-peak structure is in the shape of M. Each M-shaped three-dimensional nano-structure 142 includes a first peak 1422 and a second peak 1424. The first peak 1422 and the second peak 1424 substantially extend along the X direction. The first peak 1422 includes a first surface 1422a and a second surface 1422b. The first surface 1422a and the second surface 1422b intersects to form an intersection line and an included angle θ of the first peak 1422. The intersection line can be a straight line, a curvy line, or a polygonal line. The included angle θ is greater than 0 degree and smaller than 180 degrees. In one embodiment, the included angle θ ranges from about 30 degrees to about 90 degrees. The first surface 1422a and the second surface 1422b can be planar, curvy, or wrinkly. In one embodiment, the first surface 1422a and the second surface 1422b is planar. The first surface 1422a is intersected with the surface of the substrate 100 at an angle α. The angle α is greater than 0 degrees and less than or equal to 90 degrees. In one embodiment, the angle α is greater than 80 degrees and less than 90 degrees.

The first surface 1422a includes a side connected to the surface of the substrate 100, and extends away from the substrate 100 to intersect with the second surface 1422b. The second surface 1422b includes a side connected with the second peak 1424 and extends away from the substrate 100 with an angle β. The angle β is greater than 0 degrees and smaller than 90 degrees.

The second peak 1424 includes a third surface 1424a and a fourth surface 1424b. The structure of the second peak 1424 is substantially the same as that of the first peak 1422. The third surface 1424a and the fourth surface 1424b intersect with each other to form the included angle of the second peak 1424. The third surface 1424a includes a side intersected with the surface of the substrate 100, and extends away from the substrate 100 to intersect with the fourth surface 1424b. The fourth surface 1424b includes a side intersected with the third surface 1424a to form the included angle of the second peak 1424, and extends to intersect with the second surface 1422b of the first peak 1422 to define a first groove 1426. A second groove 1428 is defined between two adjacent three-dimensional nano-structures 142. The second groove 1428 is defined by the third surface 1424a of the second peak 1424 and the first surface 1422a of the first peak 1422 of the adjacent three-dimensional nano-structure 142.

The first peak 1422 and the second peak 1424 protrude out of the substrate 100. The height of the first peak 1422 and the second peak 1424 is arbitrary and can be selected according to need. In one embodiment, both the height of the first peak 1422 and that of the second peak 1424 range from about 150 nanometers to about 200 nanometers respectively. The height of the first peak 1422 can be substantially equal to that of the second peak 1424. Both the first peak 1422 and the second peak 1424 have the highest point respectively. The highest point of the first peak 1422 and the second peak 1424 is defined as the farthest point away from the surface of the substrate 100. In one three-dimensional nano-structure 142, the highest point of the first peak 1422 is spaced from that of the second peak 1424 with a certain distance ranging from about 20 nanometers to about 100 nanometers. The first peak 1422 and the second peak 1424 extend substantially along the X direction. The cross-section of the first peak 1422 and the second peak 1424 can be a trapezoid or a triangle, and the shape of the first peak 1422 and the second peak 1424 can be substantially the same. In one embodiment, the cross-section of the first peak 1422 and the second peak 1424 is in the shape of a triangle. The first peak 1422 and the second peak 1422 form the double-peak structure. In one embodiment, the first peak 1422, the second peak 1424, and the substrate 100 form an integrated structure. Because of the limitation of the technology, the first surface 1422a and the second surface 1422b can not be absolutely planar.

In each M-shaped three-dimensional nano-structure 142, the first peak 1422 and the second peak 1424 define the first groove 1426. The extending direction of the first groove 1426 is substantially the same as the extending direction of the first peak 1422 and the second peak 1424. The cross-section of the first groove 1426 is V-shaped. The depth $h_1$ of the first groove 1426 in different three-dimensional nano-structures 142 is substantially the same. The depth $h_1$ is defined as the distance between the highest point of the first peak 1422 and the bottom of the first groove 1426. The depth of the first groove 1426 is less than the height of the first peak 1422 and the second peak 1424.

The second groove 1428 extends substantially along the extending direction of the three-dimensional nano-structures 142. The cross-section of the second groove 1428 is V-shaped or an inverse trapezium. Along the extending direction, the cross-section of the second groove 1428 is substantially the same. The depth $h_2$ of the second grooves 1428 between each two adjacent three-dimensional nano-structures 142 is substantially the same. The depth $h_2$ is defined as the distance between the highest point and the bottom of the second groove 1428. The depth of the second groove 1428 is greater than that of the first groove 1426, and the ratio between $h_1$ and $h_2$ ranges from about 1:1.2 to about 1:3 ($1:1.2 \leq h_1:h_2 \leq 1:3$). The depth of the first groove 1426 ranges from about 30 nanometers to about 120 nanometers, and the depth of the second groove 1428 ranges from about 90 nanometers to about 200 nanometers. In one embodiment, the depth of the first groove 1426 is about 80 nanometers, and the depth of the second groove 1428 is about 180 nanometers. The depth of the first groove 1426 and the second groove 1428 can be selected according to need.

The width of the three-dimensional nano-structure 142 ranges from about 100 nanometers to about 200 nanometers. The width of the three-dimensional nano-structure 142 is defined as the maximum span of the three-dimensional nano-structure 142 along the Y direction. And this span is gradually decreased along the direction away from the substrate 100. Thus in each three-dimensional nano-structure 142, the distance between the highest point of the first peak 1422 and that of the second peak 1424 is less than the width of the three-dimensional nano-structure 142. The plurality of three-dimensional nano-structures 142 can be distributed in a certain interval, and the interval can be substantially the same. The interval forms the second groove 1428. The distance $\lambda_0$ between the two adjacent three-dimensional nano-structures 120 ranges from about 0 nanometers to about 200 nanometers. The distance between each two adjacent three-dimensional nano-structures 120 can be substantially the same. The distance $\lambda_0$ can be increased with the increase of the height of the first peak 1422 and the second peak 1424, and decreased with the reduction of them. In the Y direction, the distance $\lambda_0$ can be increased, decreased, or periodical varied. If the distance $\lambda_0=0$, the cross-section of the second groove 1428 is V-shaped. If the distance $\lambda_0>0$, the cross-section of the second groove 1428 is in the shape of an inverse trapezium.

Along the Y direction, the plurality of three-dimensional nano-structures 142 is distributed in a certain period P. One period P is defined as the width $\lambda$ of the three-dimensional nano-structures 142 added with the distance $\lambda_0$. The period P of the plurality of three-dimensional nano-structures 142 can range from about 100 nanometers to about 500 nanometers. The period P, the width $\lambda$, and the distance $\lambda_0$ satisfy the following formula: $P=\lambda+\lambda_0$. The period P, the width $\lambda$, and the distance $\lambda_0$ is measured in nanometers. The period P can be a constant, and $\lambda_0$ or $\lambda$ can be a dependent variable. Furthermore, one part of the three-dimensional nano-structures 142 can be aligned in a first period, and another part of the three-dimensional nano-structures 142 can be aligned in a second period. In one embodiment, the period P is about 200 nanometers, the width $\lambda$, is about 190 nanometers, and the distance $\lambda 0$ is about 10 nanometers.

The first semiconductor layer 110 is formed on the plurality of three-dimensional nano-structure arrays 140. The surface of the first semiconductor layer 110 which connects with the three-dimensional nano-structure array 140 forms a patterned surface. The first semiconductor layer 110 is an N-type semiconductor or a P-type semiconductor. The material of the N-type semiconductor can include N-type gallium nitride, N-type gallium arsenide, or N-type copper phosphate. The material of the P-type semiconductor can include P-type gallium nitride, P-type gallium arsenide, or P-type copper phosphate. The N-type semiconductor is configured to provide photons, and the P-type semiconductor is configured to provide holes. The thickness of the first semiconductor layer 110 ranges from about 1 µm to about 5 µm. In one embodiment, the first semiconductor layer 110 is an N-type gallium nitride doped with Si. The first semiconductor layer 110 includes a first surface and a second surface opposite to the first surface. The first surface is contacted with the substrate 100. The second surface includes a first region and a second region based on their function. The first region is used to locate the active layer 120 and the second semiconductor layer 130, and the second region is used to locate the first electrode 112.

The active layer 120 and the second semiconductor layer 130 are stacked on the first region in that order. The active layer 120 can cover the entire surface of the first region. The active layer 120 is a photon excitation layer and can be one of a single layer quantum well film or multilayer quantum well films. The active layer 120 is made of GaInN, AlGaInN, GaSn, AlGaSn, GaInP, or GaInSn. In one embodiment, the active layer 120 has a thickness of about 0.3 µm and includes one layer of GaInN and another layer of GaN. The GaInN layer is stacked with the GaN layer.

The second semiconductor layer 130 is located on the active layer 120. In one embodiment, the second semiconductor layer 130 covers the entire surface of the active layer 120. The thickness of the second semiconductor layer 130 ranges from about 0.1 µm to about 3 µm. The second semiconductor layer 130 can be an N-type semiconductor layer or a P-type semiconductor layer. Furthermore, the type of the second semiconductor layer 130 is different from the type of the first semiconductor layer 110. A surface of the second semiconductor layer 130 is used as an light emitting surface of the LED 10. In one embodiment the second semiconductor layer 130 is a P-type gallium nitride doped with Mg.

The first electrode 112 is electrically connected with the first semiconductor layer 110 and spaced from the active layer 120. The first electrode 112 covers at least part of the surface of the second region. The first electrode 112 is a single layer structure or a multi-layer structure. The first electrode 112 can be an N-type electrode or a P-type electrode according the first semiconductor layer 110. The material of the first electrode 112 can be selected from Ti, Ag, Al, Ni, Au, or any combination of them. The material of the first electrode 112 can also be indium-tin oxide (ITO) or carbon nanotube film. In one embodiment, the first electrode 112 is a two-layer structure consisted of a Ti layer with about 15 nm in thickness and an Au layer with about 100 nm in thickness.

The second electrode 132 can be an N-type electrode or P-type electrode. The type of the second electrode 132 is the same as the second semiconductor layer 130. The shape of the second electrode 132 is arbitrary and can be selected according to need. The second electrode 132 covers the entire surface of the second semiconductor layer 130. The material of the second electrode 132 can be Ti, Ag, Al, Ni, Au or any combination of them. The second electrode 132 can be used as a reflector of the LED 10 to reflect the photons at the same time.

Furthermore, a reflector layer can be located on the surface of the second semiconductor layer 130. The material of the reflector can be titanium (Ti), silver (Ag), aluminum (Al), nickel (Ni), gold (Au) or any combination thereof. The reflector includes a smooth surface having a high reflectivity. The photons reach the reflector and will be reflected by the reflector, thus these photons can be extracted out of the LED 10, and the light extraction efficiency of the LED 10 can be improved.

When the photons reach the light emitting surface with a large incident angle, the plurality of three-dimensional nano-structures 142 can change the motion direction of the photons, so that these photons can be extracted from the light emitting surface. Furthermore, because the three-dimensional nano-structure 142 is in the shape of an M, the M-shaped three-dimensional nano-structures 142 can function as two layers of three-dimensional nano-structures assembled together. The light extraction efficiency of the LED 10 will be improved.

Figure 5:
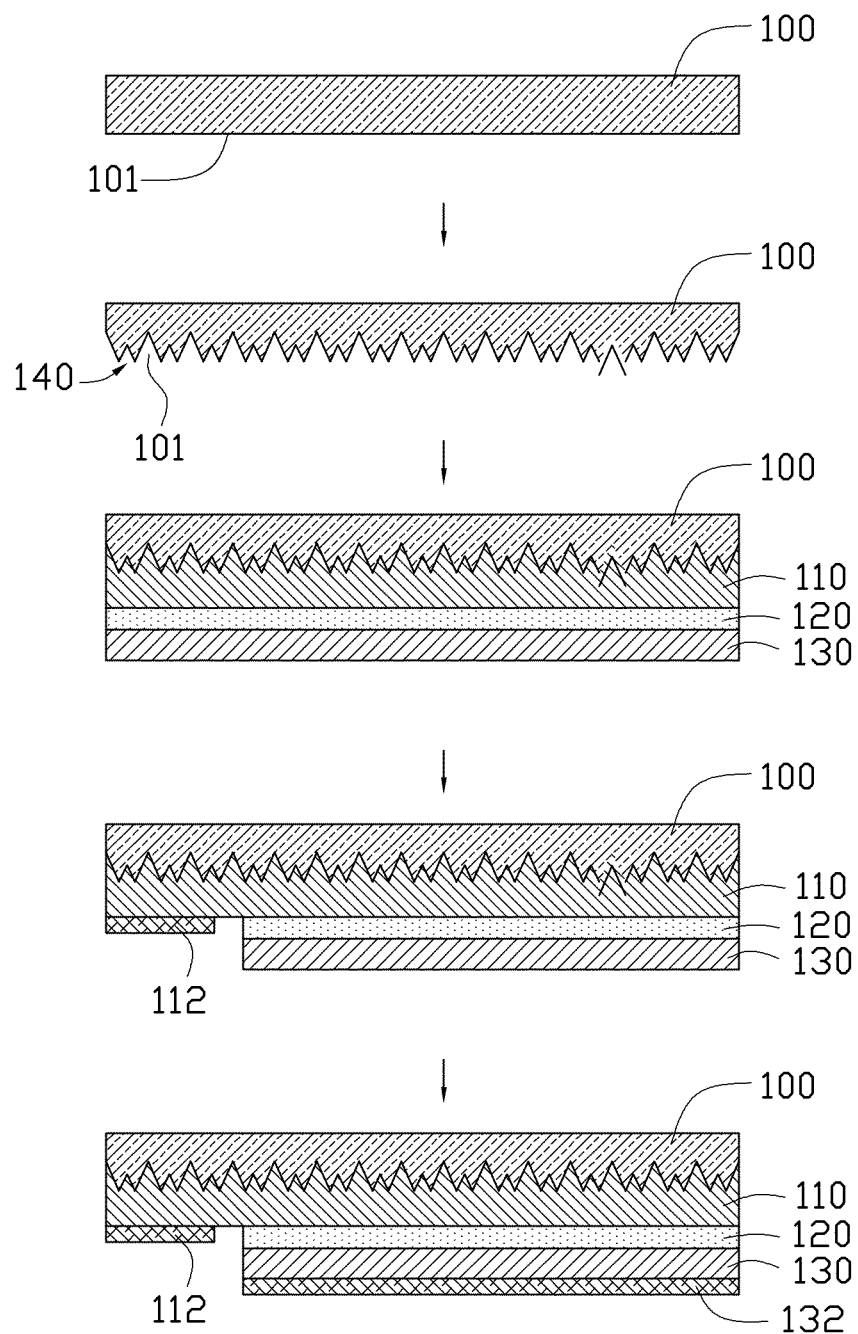
FIG. 5 is a flowchart of one embodiment of a method for making an LED.

Referring to FIG. 5, one embodiment of a method for making the LED 10 includes the following steps:

S11, providing a substrate 100;

S12, forming a three-dimensional nano-structure array 140 on the substrate 100, wherein the three-dimensional nano-structure array 140 includes an epitaxial growth surface 101;

S13, growing a first semiconductor layer 110, an active layer 120, and a second semiconductor layer 130 on the epitaxial growth surface 101 in that order;

S14, applying a first electrode 112 electrically connected to the first semiconductor layer 110; and S15, locating a second electrode 132 electrically connected to the second semiconductor layer 130.

In step (S11), the material of the substrate 100 can be selected according to the material of the first semiconductor layer 110. The first semiconductor layer 110 and the substrate 100 should have a small crystal lattice mismatch and a thermal expansion mismatch. The size, thickness, and shape of the substrate 100 can be selected according to need. In one embodiment, the substrate 100 is a sapphire substrate.

Figure 6:
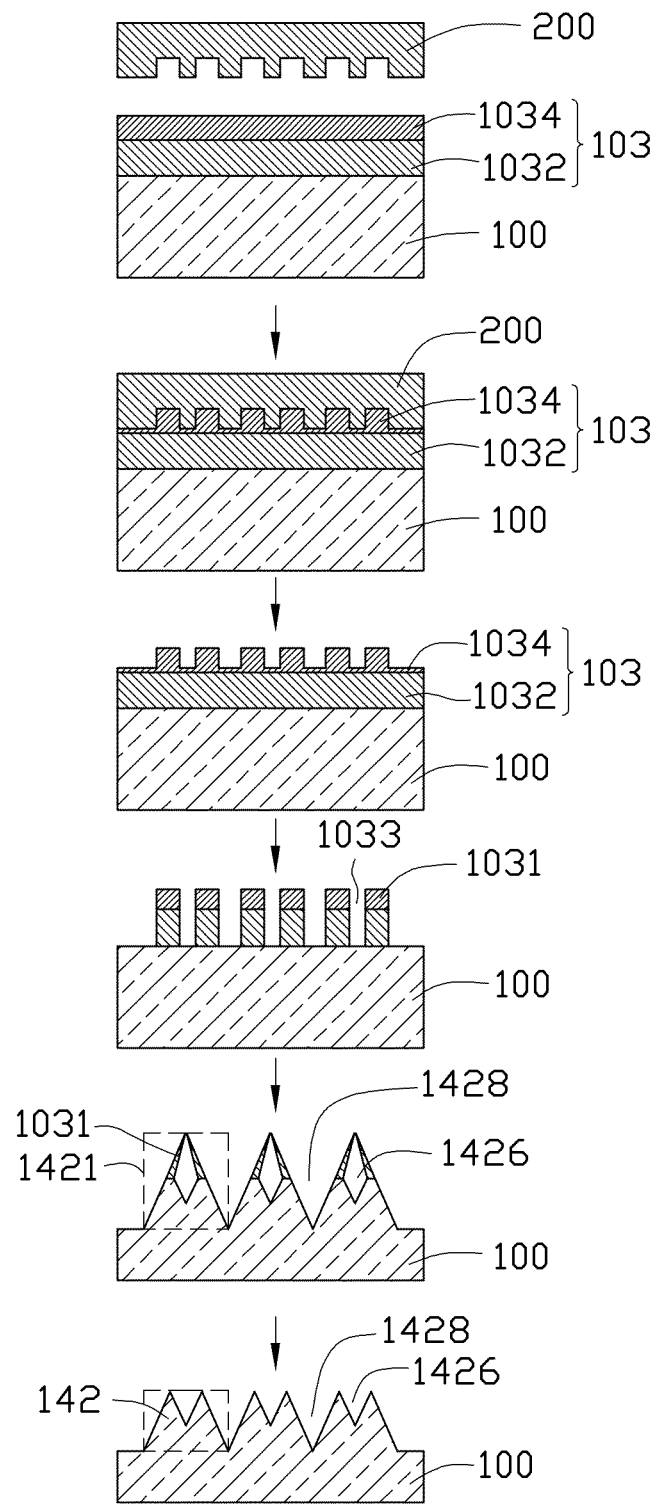
FIG. 6 is a flowchart of one embodiment of forming a three-dimensional array in the method of FIG. 5.

Also referring to FIG. 6, in step (S12), the three-dimensional nano-structure array 140 can be formed by following substeps:

S121, locating a mask layer 103 on a surface of the substrate;

S122, patterning the mask layer 103 by an imprinting and etching method;

S123, forming a plurality of three-dimensional nano-structure preforms 1421 by etching the substrate 100;

S124, forming the three-dimensional nano-structure array 140 by removing the mask layer 103.

In step (S121), the mask layer 103 can be a single layered structure or a multi-layered structure. The thickness of the mask layer 103 can be selected according to need, such as the etching depth or the etching atmosphere. Hereafter the high precision of the pattern formed in the mask layer 103 can be achieved. The mask layer 103 is a single layered structure, and the material of the mask layer 103 can be selected from a group consisting of ZEP520A which is developed by Zeon Corp of Japan, HSQ(hydrogen silsesquioxane), PMMA (Polymethylmethacrylate), PS(Polystyrene), SOG(silicon on glass) and other silitriangle oligomers. The mask layer 103 is used to protect a portion of the substrate 100.

In one embodiment, the mask layer 103 is a multi-layered structure. The mask layer 103 includes a first mask layer 1032 and a second mask layer 1034 stacked on the substrate 100 in that order, with the second mask layer 1034 covering the first mask layer 1032. The first mask layer 1032 and the second mask layer 1034 can be selected according to need. The material of the first mask layer 1032 can be selected from the group consisting of ZEP520A, PMMA, PS, SAL601 and ARZ720. The material of the second mask layer 1034 can be selected from the group consisting of HSQ, SOG, and other silitriangle oligomers. The second mask layer 1034 can be printed by a mechanical method to ensure the precision of the mask layer 103. In one embodiment, the material of the first mask layer 1032 is ZEP520A, and that of the second mask layer 1034 is HSQ. The first mask layer 1032 and the second mask layer 1034 can be formed by a screen printing method or a deposition method.

The step (S121) includes sub-steps of:

S121a, forming the first mask layer 1032; and

S121b, forming the second mask layer 1034.

In the step (S121a), the first mask layer 1032 is formed by the following steps. First, the substrate 100 is cleaned in a clean room. Second, a layer of positive electron-beam resist can be spin-coated on the substrate 100 at a speed of about 500 rounds per minute to about 6000 rounds per minute, for about 0.5 minutes to about 1.5 minutes. The positive electron-beam resist can be a ZEP520A resist, which is developed by Zeon Corp of Japan. Third, the substrate 100 with the positive electron-beam resist can be dried at a temperature of about 140 degrees centigrade to 180 degrees centigrade, for about 3 minutes to about 5 minutes, thereby forming the first mask layer 1032 on the substrate 100. The thickness of the first mask layer 1032 can be in a range of about 100 nanometers to about 500 nanometers.

In the step (S121b), the mask layer 1034 can be a layer of HSQ resist. The HSQ resist is spin-coated on the first mask layer 1032 under high pressure at a speed of about 2500 rounds per minute to about 7000 rounds per minute, for about 0.5 minutes to about 2 minutes. The thickness of the second mask layer 1032 can range from about 100 nanometers to about 300 nanometers. The HSQ can be pressed to be deformed at room temperature. Moreover, the HSQ has good structural stability and provides a high resolution, often better than 10 nm.

Furthermore, a transition layer (not shown) can be deposited on the first mask layer 1032 before the step of forming the second mask layer 1034. In one embodiment, the transition layer can be a glassy silicon dioxide film with a thickness of about 10 nanometers to about 100 nanometers. The transition layer is used to protect the first mask layer 1032 during nanoimprinting the second mask layer 1034.

In step (S122), the mask layer 103 can be patterned by the following method:

(a), providing a patterned template 200;

(b), attaching the template 200 on the second mask layer 1034, imprinting the template 200 to form a plurality of slots, and removing the template 200;

(c), removing the residual second mask layer 1034 in the bottom of the slot to expose the first mask layer 1032; and (d), patterning the mask layer 103 by removing one part of the first mask layer 1032 corresponding with the slots.

In step (a), the template 200 can be made of rigid materials, such as nickel, silicon, and carbon dioxide. The template 200 can also be made of flexible materials, such as PET, PMMA, polystyrene (PS), and polydimethylsiloxane (PDMS). The template 200 can be fabricated through an electron beam lithography method with the nano-pattern formed therein. The template 200 includes a plurality of protruding structures. The protruding structures are substantially parallel with each other and spaced from each other to form an array, concentric circles, or concentric rectangles. A slot is defined between the two adjacent protruding structures. The protruding structures form the nano-pattern of the template 200. The nano-pattern can be designed according to the actual application. In one embodiment, the protruding structures are plurality of protruding structures extending substantially along the same direction, and one slot is defined between the adjacent two bar-shape structures. The width of the protruding structure and that of the slot can be the same. In one embodiment, both the width of the protruding structure and that of the slot range from about 50 nanometers to about 200 nanometers.

In step (b), the template 200 is then pressed towards the substrate 100 at room temperature. During this process, the protruding structures are pressed into the second mask layer 1034 to form a plurality of slots in the second mask layer 1034, and some materials of the second mask layer 1034 are remained at the bottom of the slot. Finally, the template 200 is removed with the nano-pattern remaining in the second mask layer 1034. The nano-pattern of the second mask layer 1034 includes a plurality of second protruding structures and a plurality of slots. The protruding structures in the second mask layer 1034 correspond to the slots in the template 200. The slots in the second mask layer 1034 correspond to the protruding structures in the template 200.

In one embodiment, the template 200 is pressed in a vacuum environment of about $1\times10^{-1}$ millibars to about $1\times10^{-5}$ millibars. The pressure applied on the template 200 is about 2 pounds per square foot to about 100 pounds per square foot. The pressure is applied on the template 200 for about 2 minutes to about 30 minutes. There may be remaining material of the second mask layer 1034 at the bottom of the slots.

In step (c), the residual material of the second mask layer 1034 at the bottom of the slots can be removed by plasma etching. In one embodiment, a $CF_4$ reactive plasma etching method can be used to remove the remaining material of the second mask layer 1034 at the bottom of the slots. For example, the substrate 100 with the protruding structures and the slots formed in the second mask layer 1034 can be placed in a $CF_4$ reactive plasma etching system. The $CF_4$ reactive plasma etching system generates $CF_4$ plasma, and the $CF_4$ plasma then moves towards the second mask layer 1034. The remaining material of the second mask layer 1034 at the bottom of the slots will be etched away, so that the first mask layer 1032 correspond to the slots will be exposed. At the same time, the width of the top of the protruding structures in the second mask layer 1034 is decreased during the etching process, but the nano-pattern in the second mask layer 1034 will be maintained.

In step (d), the first mask layer 1032 exposed from the slots can be removed by oxygen plasma etching. For example, the substrate 100 after being treated by step (d) can be placed in an oxygen plasma etching system. The power of the oxygen plasma etching system can range from about 10 watts to about 150 watts. The speed of the oxygen plasma can range from about 2 sccm to about 100 sccm. The partial pressure of the oxygen plasma can range from about 0.5 Pa to about 15 Pa. The etching time can range from about 5 seconds to about 1 minute. During the process of etching the first mask layer 1032, the first mask layer 1032 exposed by the slots will be removed, and the substrate 100 corresponding to the slots will be exposed. The protruding structures in the second mask layer 1034 function as a mask to the oxygen plasma to ensure the resolution of the first mask layer 1032.

During the etching process, the pattern in the second mask layer 1034 will be copied onto the first mask layer 1032 to form a patterned mask layer 103. The patterned mask layer 103 includes a plurality of protruding structures 1031 on the surface of the substrate 100. Each protruding structure 1031 includes the first mask layer 1032 and the second mask layer 1034 stacked together. A slot 1033 is defined between each two adjacent protruding structures 1031, and the surface of the substrate 100 which correspond to the slot 1033 is exposed. During the process of etching the first mask layer 1032, the top of the protruding structures of the second mask layer 1034 will also be partly etched. But the etching speed to the second mask layer 1034 is much lower than that of the first mask layer 1032, and the nano-pattern in the second mask layer 1034 can still be maintained. Thus, the resolution of the mask layer 103 can be improved.

In step (S123), the substrate 100 after step (S122) can be placed in an inductively coupled plasma device to etch the substrate 100 exposed by the mask layer 103. The etching gas can be selected according to the material of the substrate 100 and the mask layer 103. During the etching process, the surface of the substrate 100 exposed by the slots 1033 of the mask layer 103 will be etched, thereby forming a plurality of grooves in the substrate 100.

Figure 7:
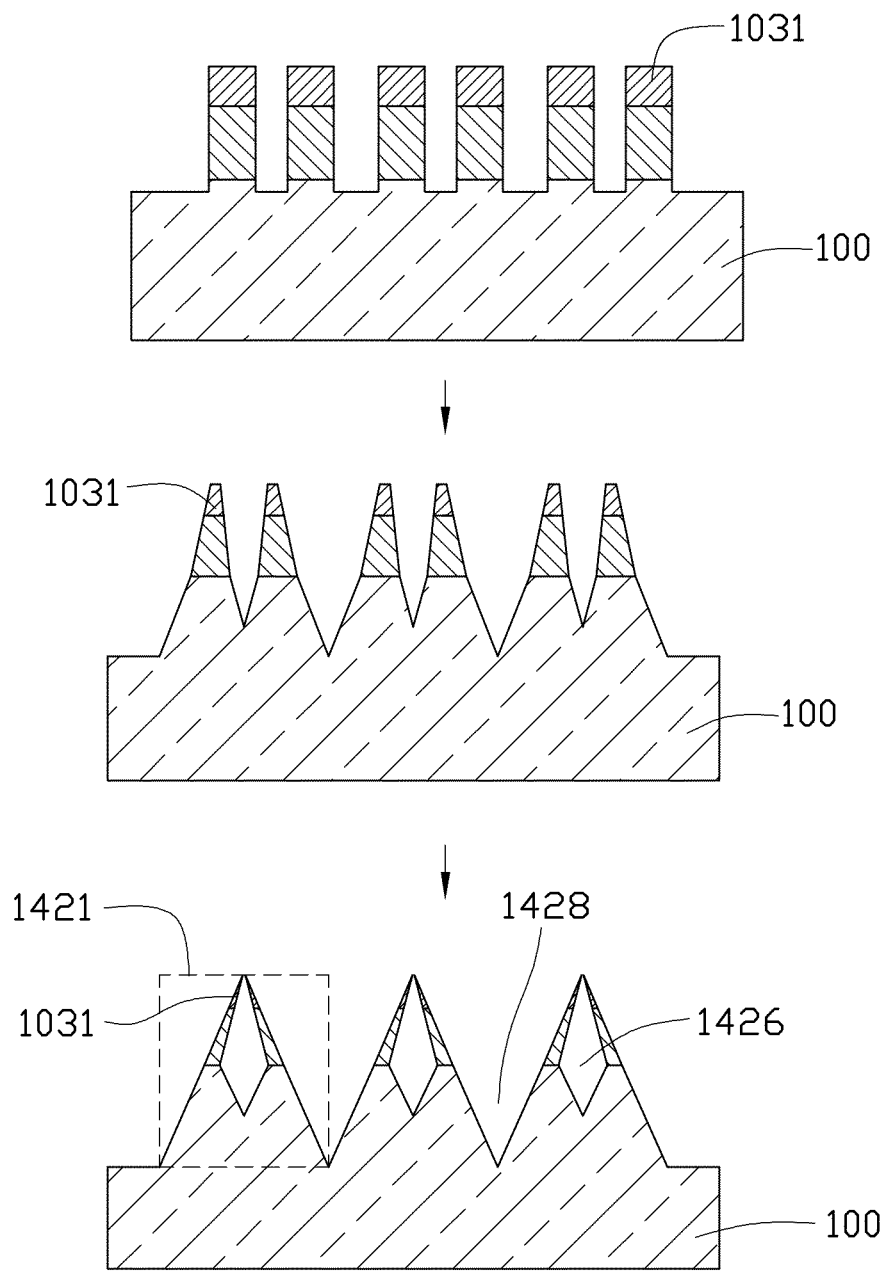
FIG. 7 shows a process of one embodiment of forming a plurality of three-dimensional nano-structure preforms in the method of FIG. 6.
Figure 8:
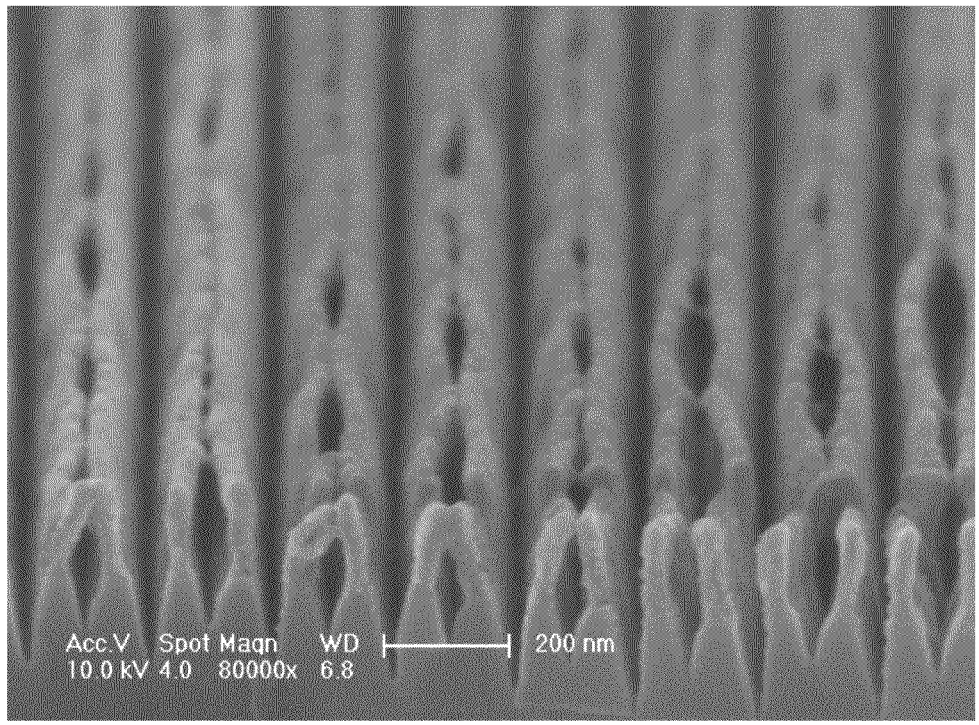
FIG. 8 is a SEM image of a plurality of three-dimensional nano-structure preforms of FIG. 7.

Referring to FIG. 7 and FIG. 8, the etching process of the substrate 100 includes the following stages:

first stage, forming a plurality of grooves with substantially the same depth by etching the surface of the substrate 100 by etching gas;

second stage, continuing the etching process so that every two adjacent protruding structures 1031 begin to slant face to face to form a protruding pair; and third stage, continuing the etching process so that the two adjacent protruding structures 1031 gradually slant until the top of the two adjacent protruding structures 1031 contact each other.

In the first stage, the etching gas etches the exposed surface of the substrate 100 to form a plurality of grooves. The grooves have substantially the same depth because of substantially the same etching speed.

In the second stage, during the etching process, the etching gas will be reacted with the substrate 100 to form a protective layer. The protective layer will reduce the etching speed to the substrate 100, and the width of the grooves will be slowly decreased from the outer surface to the bottom of the grooves. Thus, the inner wall of the grooves will not be absolutely perpendicular to the surface of the substrate 100, but form an angle. Furthermore, the etching does not only etch the substrate 100, but also etch the top of the protruding structures 1031. The width of the top of the protruding structures 1031 will be decreased. The resolution of the mask layer 103 will not be affected because the etching speed of the top of the protruding structures 1031 is far smaller than that of the substrate 100. Furthermore, every two adjacent protruding structures 1031 will slant face to face.

In the third stage, the top of the structures of the two adjacent protruding structures 1031 will gradually approach each other. The etching speed of the substrate 100 corresponding to these two adjacent protruding structures 1031 will decrease, and the width of the grooves will gradually decrease from the outer surface to the bottom of the grooves. Because the two adjacent protruding structures 1031 slant face to face to form a protruding pair, the etching speed of the substrate 100 corresponding to the protruding pair will further decrease. Eventually, the top of the two adjacent protruding structures 103 are contacting each other, and the etching gas can no longer etch the substrate 100 corresponding to the two adjacent protruding structures 103, thus the first groove 1426 is formed on the surface of the substrate 100. But between every two protruding pairs, the etching speed will change less than that of the closed adjacent protruding structures 1031. Thus the second grooves 1428 is formed, and the depth of the second grooves 1428 will be greater than that of the first grooves 1426. The plurality of three-dimensional nano-structure preforms 1421 is then obtained on the substrate 100.

In one embodiment, the etching gas includes $Cl_2$, $BCl_3$, $O_2$, and Ar. The power of the inductively coupled plasma device ranges from about 10 watts to about 100 watts, the flow speed of the etching gas ranges from about 8 sccm to about 150 sccm, the pressure of the etching gas can range from about 0.5 Pa to about 15 Pa, and the etching time can range from about 5 seconds to about 5 minutes. In the etching gas, the flow speed of the $Cl_2$ ranges about 2 sccm to about 60 sccm, the flow speed of the $BCl_3$ ranges from about 2 sccm to about 30 sccm, the flow speed of the $O_2$ ranges from about 3 sccm to about 40 sccm, and the flow speed of the Ar ranges from about 1 sccm to about 20 sccm. In one embodiment, the flow speed of the etching gas ranges from about 40 sccm to about 100 sccm to improve the resolution and the etching speed. In another embodiment, the power of the inductively coupled plasma device is about 70 watts, the flow speed of the etching gas is about 40 sccm, the pressure of the etching gas is about 2 Pa, and the etching time is about 2 minutes. In the etching gas, the flow speed of the $Cl_2$ is about 26 sccm, the flow speed of the $BCl_3$ is about 16 sccm, the flow speed of the $O_2$ is about 20 sccm, and the flow speed of the Ar is about 10 sccm.

The mask layer 103 and the etching gas is not limited. The etching gas can include only one gas or a mixture of different gases, so long as the top of the two adjacent protruding structures 1031 in the mask layer 103 can be closed. The flow speed of the etching gas, the pressure, the etching time, and the ratio between the different gases can be dependent upon the three-dimensional nano-structure 102.

In step (S124), the mask layer 103 can be removed by dissolving in a stripping agent such as tetrahydrofuran (THF), acetone, butanone, cyclohexane, hexane, methanol, or ethanol. In one embodiment, the stripping agent is butanone, and the mask layer 103 is dissolved in butanone and separated from the substrate 100. The plurality of three-dimensional nano-structures 142 is formed on the substrate 100 by removing the mask layer 103. The plurality of three-dimensional nano-structures 142 and the substrate 100 are integrated to an integrated structure. The plurality of three-dimensional nano-structures 142 includes an epitaxial growth surface 101 to grow the first semiconductor layer 110.

The three-dimensional nano-structure array 140 can also be formed by locating another dielectric layer (not shown) or a semiconductor layer (not shown) on the substrate 100 and etching the dielectric layer. Thus the three-dimensional nano-structure array 140 is located on the surface of the substrate 100.

In step (S13), the first semiconductor layer 110, the active layer 120 and the second semiconductor layer 130 can be grown respectively via a process of molecular beam epitaxy (MBE), chemical beam epitaxy (CBE), vacuum epitaxy, low temperature epitaxy, choose epitaxy, liquid phase deposition epitaxy (LPE), metal organic vapor phase epitaxy (MOVPE), ultra-high vacuum chemical vapor deposition (UHVCVD), hydride vapor phase epitaxy (HYPE), and metal organic chemical vapor deposition (MOCVD).

In one embodiment, the first semiconductor layer 110 is Si-doped N-type GaN. The first semiconductor layer 110 is made by a MOCVD method, and the growth of the first semiconductor layer 110 is a heteroepitaxial growth. In the MOCVD method, the nitrogen source gas is high-purity ammonia ($NH_3$), the carrier gas is hydrogen ($H_2$), the Ga source gas is trimethyl gallium (TMGa) or triethyl gallium (TEGa), and the Si source gas is silane ($SiH_4$). The growth of the first semiconductor layer 110 includes the following steps:

(S131), placing the substrate 100 with the first carbon nanotube layer 110 thereon into a reaction chamber and heating the substrate 100 to about 1100° C. to about 1200° C., introducing the carrier gas, and baking the substrate 100 for about 200 seconds to about 1000 seconds;

(S132), growing the low-temperature GaN layer by reducing the temperature to a range from about 500° C. to 650° C. in the carrier gas atmosphere, and introducing the Ga source gas and the nitrogen source gas at the same time;

(S133), stopping the flow of the Ga source gas in the carrier gas and nitrogen source gas atmosphere, increasing the temperature to a range from about 1100° C. to about 1200° C., and maintaining the temperature for about 30 seconds to about 300 seconds;

(S134), growing the high quality first semiconductor layer 110 by maintaining the temperature of the substrate 100 in a range from about 1000° C. to about 1100° C., and reintroducing the Ga source gas again and the Si source gas.

In step (S132), the low-temperature GaN is used as a buffer layer (not shown) to grow the first semiconductor layer 110. The thickness of the buffer layer is less than the thickness of the first carbon nanotube layer 110. Because the first semiconductor layer 110 and the substrate 100 have different lattice constants, the buffer layer is used to reduce the lattice mismatch during the growth process, thus the dislocation density of the first semiconductor layer 110 will decrease.

The growth method of the active layer 120 is similar to the first semiconductor layer 110. In one embodiment, the indium source gas is trimethyl indium. The growth of the active layer 120 after the growth of the first semiconductor layer 110 includes the following steps:

(a1) stopping the flow of the Si source gas and maintaining the temperature of the reaction chamber to a range from about 700° C. to about 900° C., the pressure of the reaction reaction chamber range from about 50 torrs to about 500 torrs; and (a2) introducing the indium source gas and growing InGaN/GaN multilayer quantum well film to form the active layer 120.

The second semiconductor layer 130 is grown after the growth of the active layer 120. In one embodiment, the Mg source gas is ferrocene magnesium ($Cp_2Mg$), and the method includes the following steps:

(b1) stopping the flow of the indium source gas and maintaining the temperature of the reaction chamber in a range from about 1000° C. to about 1100° C., and maintaining the pressure of the reaction reaction chamber in a range from about 76 torrs to about 200 torrs; and (b2) introducing the Mg source gas and growing P-type gallium nitride doped with Mg to form the second semiconductor layer 130.

In step (S14), the first electrode 112 can be formed by the following steps:

S141, exposing a portion of the surface of the first semiconductor layer 110 by etching the second semiconductor layer 130 and the active layer 120; and S142, locating the first electrode 112 on the exposed portion of the first semiconductor layer 110.

In step (S141), the second semiconductor layer 110 and the active layer 120 can be etched via light etching, electronic etching, plasma etching, or a chemical corrosion method.

In step (S142), the first electrode 112 can be formed via a process of physical vapor deposition, such as electron beam evaporation, vacuum evaporation, ion sputtering, or any physical deposition. Furthermore, the first electrode 112 can also be formed by directly attaching a conductive sheet on the exposed portion of the first semiconductor layer 110. The first electrode 112 is located on the second region and spaced from the active layer 120 and the second semiconductor layer 130.

In step (S15), the method for making the second electrode 132 is the same as that of the first electrode 112. The second electrode 132 is located on the surface of the second semiconductor layer 130 away from the active layer 120. The second electrode 132 is a continuous layered-structure and covers the entire surface of the second semiconductor layer 130. The second electrode 130 is also used as a reflector of the LED 10.

The method for making the LED 10 has the following advantages. First, the nano-imprinting method can be carried out at room temperature, and the template does not need pre-treatment, thus the method is simple and low in cost. Second, the plurality of M-shaped three-dimensional structures can be easily formed on the light emitting surface of the LED 10, and the productivity of the patterned substrate can be improved.

Figure 9:
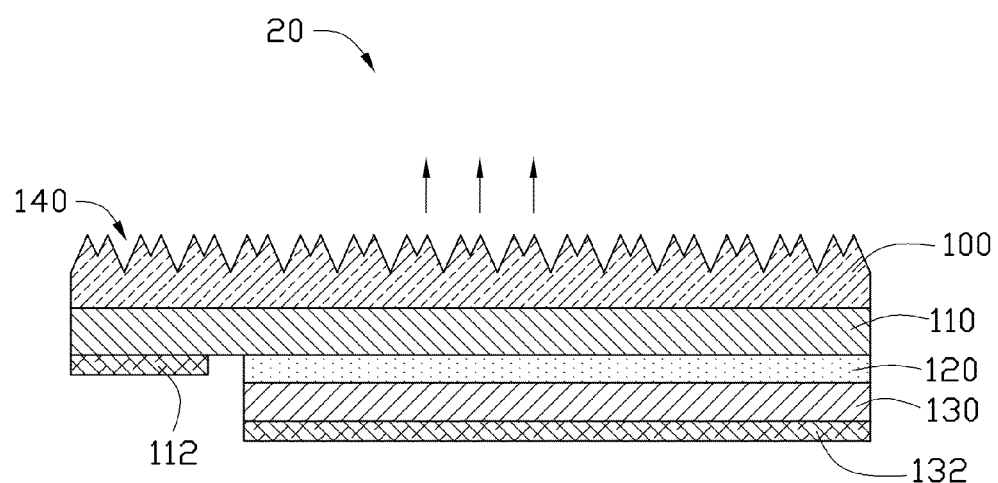
FIG. 9 shows a schematic view of one embodiment of an LED.

Referring to FIG. 9, an LED 20 includes a substrate 100, a first semiconductor layer 110, an active layer 120 and a second semiconductor layer 130, a first electrode 112, a second electrode 132 and a three-dimensional nano-structure array 140. The substrate 100 includes a first surface and an opposite second surface. The first semiconductor layer 110, the active layer 120, and the second semiconductor layer 130 are stacked on the first surface in that order. The three-dimensional nano-structure array 140 is located on the second surface. The second surface of the substrate 100 is used as the light emitting surface of the LED 20. The first electrode 112 is electrically connected with the first semiconductor layer 110, and the second electrode 132 is electrically connected with the second semiconductor layer 130.

The structure of the LED 20 is similar to that of the LED 10, except that the three-dimensional nano-structure array 140 is located on the second surface of the substrate 100. The three-dimensional nano-structure array 140 can cover a part surface of the substrate 100. In one embodiment, the three-dimensional nano-structure array 140 covers the entire surface of the substrate 100. The second electrode 132 can cover the entire surface of the second semiconductor layer 130 away from the active layer 120. Thus the LED 20 forms a vertical structure, and the current diffusion speed will improve and the heat produced in the LED 20 will decrease.

Furthermore, a reflector (not shown) can be sandwiched between the second electrode 132 and the second semiconductor layer 130. The reflector is conductive and electrically connected with the second electrode 132 and the second semiconductor layer 130. The reflector includes a smooth surface having a high reflectivity. The photons reach the reflector and will be reflected by the reflector, thus these photons can be extracted out of the LED 20, and the light extraction efficiency of the LED 20 can be improved.

Figure 10:
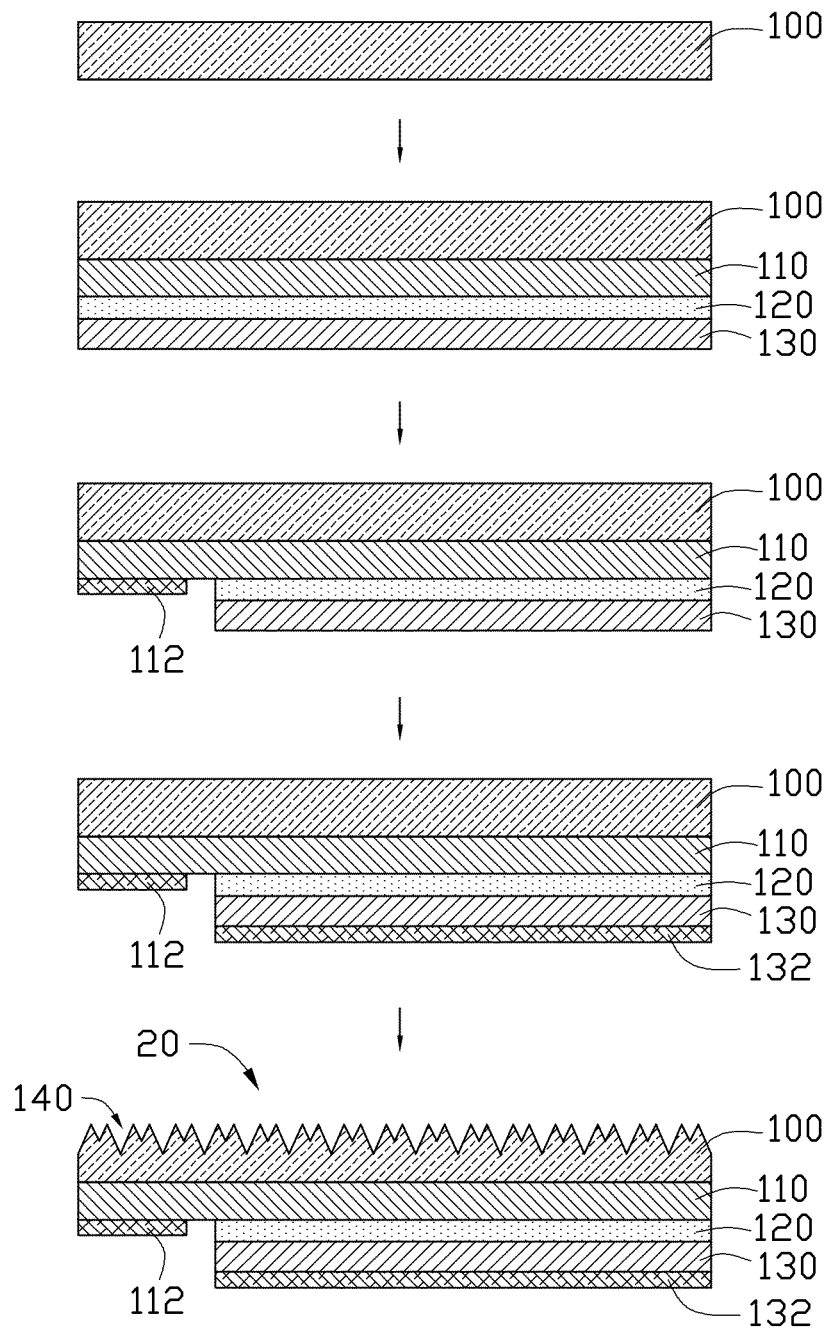
FIG. 10 is a flowchart of one embodiment of a method for making an LED.

Referring to FIG. 10, one embodiment of a method for making the LED 20 includes the following steps:

S21, providing a substrate 100 having a first surface and an opposite second surface;

S22, growing a first semiconductor layer 110, an active layer 120, and a second semiconductor layer 130 on first surface of the substrate 100 in that order;

S23, applying a first electrode 112 on the surface of the first semiconductor layer 110;

S24, applying a second electrode 132 electrically connected to the second semiconductor layer 130; and S25, forming a three-dimensional nano-structure array 140 on the second surface of the substrate 100.

The method of making the LED 20 is similar to that of the LED 10, except that the three-dimensional nano-structure array 140 is located on the second surface of the substrate 100.

In detail, the three-dimensional nano-structure array 140 is located on the light emitting surface of the LED 20. The thee-dimensional nano-structure array 140 can be formed by etching the second surface of the substrate.

Figure 11:
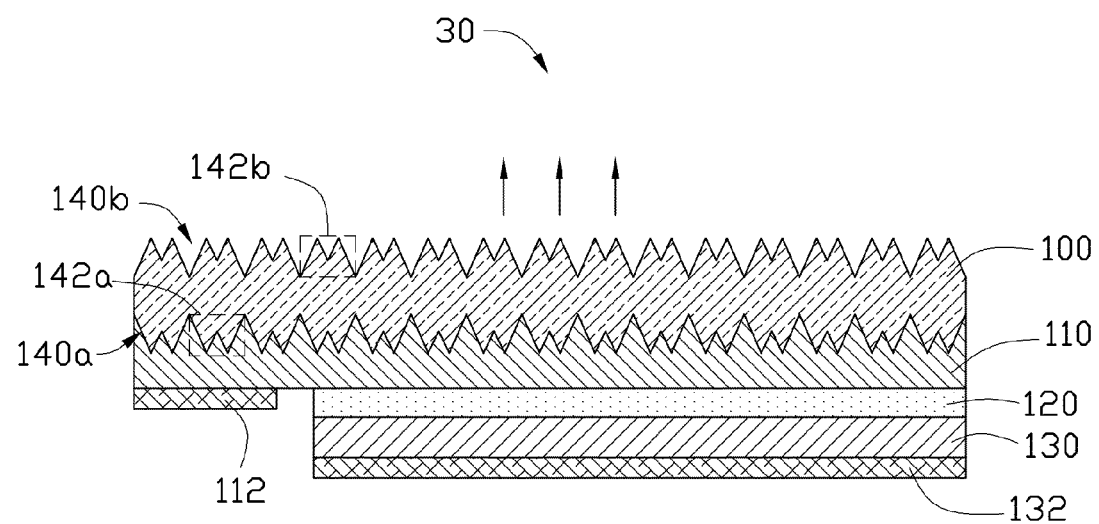
FIG. 11 shows a schematic view of one embodiment of an LED.

Referring to FIG. 11, an LED 30 includes a substrate 100, a first semiconductor layer 110, an active layer 120, a second semiconductor layer 130, a first electrode 112, a second electrode 132, a first three-dimensional nano-structure array 140a, and a second three-dimensional nano-structure array 140b. The first electrode 112 is electrically connected with the first semiconductor layer 110, and the second electrode 132 is electrically connected with the second semiconductor layer 130.

The structure of the LED 30 is similar to that of the LED 10 except for the additional second three-dimensional nano-structure array 140b on the light emitting surface of the LED 30. The substrate 100 includes a first surface (not shown) and an opposite second surface (not shown). The first three-dimensional nano-structure array 140a is located on the first surface. The second three-dimensional nano-structure array 140b is located on the second surface. The first semiconductor layer 110, the active layer 120, and the second semiconductor layer 130 is stacked on the surface of the first three-dimensional nano-structure array 140a in that order. The second surface of the substrate 100 is used as the light emitting surface of the LED 30.

The structure of the first three-dimensional nano-structure array 140a and the second three-dimensional nano-structure array 140b is similar to the three-dimensional nano-structure array 140 of LED 10 respectively. The first three-dimensional nano-structure array 140a includes a plurality of first three-dimensional nano-structures 142a, and the second three-dimensional nano-structure array 140b includes a plurality of second three-dimensional nano-structures 142b. The first three-dimensional nano-structure 142a is a protruding structure extending substantially along a first direction, and the second three-dimensional nano-structure 142b is a protruding structure extending substantially along a second direction. The first direction can be substantially parallel or intersect with the second direction. In one embodiment, the first direction is substantially perpendicular with the second direction to improve the light extraction efficiency. The second electrode 132 is located on the second three-dimensional nano-structure 142b and electrically connected with the second semiconductor layer 130.

Furthermore, a reflector layer (not shown) can be sandwiched between the second semiconductor layer 130 and the second electrode 132.

Figure 12:
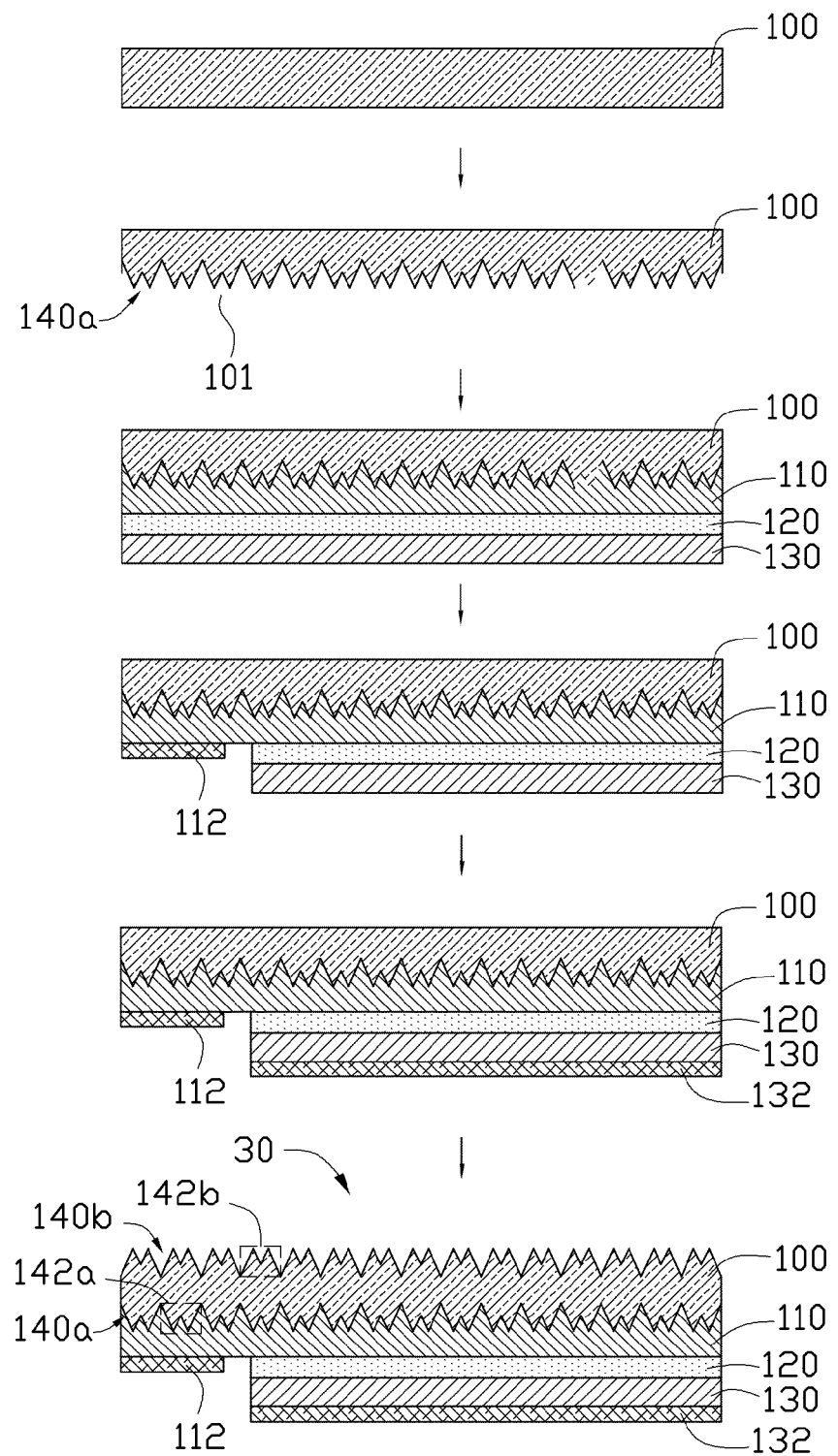
FIG. 12 is a flowchart of one embodiment of a method for making an LED.

Referring to FIG. 12, a method for making an LED 30 includes the following steps:

S31, providing a substrate 100 having a first surface and an opposite second surface;

S32, locating a first three-dimensional nano-structure array 140a on the first surface of the substrate 100;

S33, growing a first semiconductor layer 110, an active layer 120, and a second semiconductor layer 130 on the first three-dimensional nano-structure array 140b in that order;

S34, locating a second three-dimensional nano-structure array 140b on the second surface of the substrate 100;

S35, applying a first electrode 112 on the surface of the first semiconductor layer 110;

S36, applying a second electrode 132 electrically connected to the second semiconductor layer 130.

The method of making LED 30 is the same as the method of making the LED 10, except for an additional step of locating the second three-dimensional nano-structure array 140b on the second surface of the substrate 100. The second three-dimensional nano-structure array 140b is located on the light emitting surface of the LED 30.

The second three-dimensional nano-structure array 140b can cover a part of the light emitting surface. In one embodiment, the second three-dimensional nano-structure array 140b covers the entire light emitting surface. When the photons reach the first three-dimensional nano-structure array 140a and the second three-dimensional nano-structure array 140b with a large incidence angle, the motion direction of the photons can be changed, thus the photons can be extracted from the LED 30.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A light emitting diode, comprising:
   a substrate having a first surface and an opposite second surface, the second surface of the substrate being configured as a light emitting surface;
   a first semiconductor layer stacked on the substrate;
   an active layer stacked on the first semiconductor layer; and
   a second semiconductor layer stacked on the active layer;
   a first electrode electrically connected with the first semiconductor layer;
   a second electrode electrically connected with the second semiconductor layer;
   a plurality of three-dimensional nano-structures located on at least one surface of the substrate, wherein each of the plurality of three-dimensional nano-structures has a first peak and a second peak aligned side by side, a first groove is defined between the first peak and the second peak, a second groove is defined between each two adjacent three-dimensional nano-structures of the plurality of three-dimensional nano-structures, and a depth of the first groove is less than a depth of the second groove.

2. The light emitting diode of claim 1, wherein the each of the plurality of three-dimensional nano-structures is a bar-shaped protruding structure extending along a straight line, a curve line, or a polygonal line.

3. The light emitting diode of claim 1, wherein a cross-section of the each of the three-dimensional nano-structure is M-shaped.

4. The three-dimensional nano-structure array of claim 1, wherein the first peak comprises a first surface and a second surface intersecting with each other to form a first include angle, the second peak comprises a third surface and the fourth surface intersecting with each other to form a second include angle, and both the first include angle and the second include angle range from about 30 degrees to about 90 degrees.

5. The light emitting diode of claim 4, wherein a cross-section of the first peak has a shape of a trapezoid or a triangle, and a cross-section of the second peak has a shape of a trapezoid or a triangle.

6. The light emitting diode of claim 1, wherein the depth of the first groove ranges from about 30 nanometers to about 120 nanometers, and the depth of the second groove ranges from about 100 nanometers to about 200 nanometers.

7. The light emitting diode of claim 1, wherein the plurality of three-dimensional nano-structures is aligned side by side and extends to form a plurality of concentric circles or concentric rectangles.

8. The light emitting diode of claim 1, wherein the plurality of the three-dimensional nano-structures is periodically aligned, and a period of the plurality of the three-dimensional nano-structures ranges from about 100 nanometers to about 500 nanometers.

9. The light emitting diode of claim 1, wherein a distance between the each two adjacent three-dimensional nano-structures ranges from about 0 nanometers to about 200 nanometers.

10. The light emitting diode of claim 1, wherein a width of the plurality of three-dimensional nano-structures ranges from about 100 nanometers to about 300 nanometers.

11. The light emitting diode of claim 1, wherein the plurality of three-dimensional nano-structures is integrated with the substrate to form an integrated structure.

12. The light emitting diode of claim 1, wherein the plurality of three-dimensional nano-structures is only located on the first surface of the substrate, and the first semiconductor layer covers the plurality of three-dimensional nano-structures.

13. The light emitting diode of claim 1, wherein a surface of the first semiconductor layer away from the substrate comprises a first region and a second region, the second semiconductor layer and the active layer are located on the first region, the second region is exposed from the second semiconductor layer and the active layer, and the first electrode is located on the second region.

14. The light emitting diode of claim 1, further comprising a reflector sandwiched between the second semiconductor layer and the second electrode.

15. A light emitting diode, comprising:
    a substrate having a first surface and a second surface, the second surface is configured as a light emitting surface;
    a first semiconductor layer stacked on the substrate;
    an active layer stacked on the first semiconductor layer; and
    a second semiconductor layer stacked on the first surface of the substrate;
    a first electrode electrically connected with the first semiconductor layer;
    a second electrode electrically connected with the second semiconductor layer;
    a plurality of first three-dimensional nano-structures located on the first surface and aligned side by side, and a plurality of second three-dimensional nano-structures located on the second surface of the substrate and aligned side by side, wherein a cross section of each of the plurality of first three-dimensional nano-structure is M-shaped, and a cross section of each of the plurality of second three-dimensional nano-structure is M-shaped.

16. The light emitting diode of claim 15, wherein the plurality of first three-dimensional nano-structures is protruding structures aligned side by side, and the plurality of second three-dimensional nano-structures is protruding structures aligned side by side.

17. The light emitting diode of claim 16, wherein the plurality of first three-dimensional nano-structures extends substantially along a first direction, the plurality of second three-dimensional nano-structures extends substantially along a second direction, and the first direction is substantially perpendicular with the second direction.

18. The light emitting diode of claim 16, wherein the plurality of first three-dimensional nano-structures extends substantially along a first direction, the plurality of second three-dimensional nano-structures extends substantially along a second direction, and
the first direction is parallel with the second direction.

19. A light emitting diode, comprising:
a substrate having a first surface and a second surface, the second surface is configured as a light emitting surface;
a first semiconductor layer stacked on the substrate;
an active layer stacked on the first semiconductor layer; and
a second semiconductor layer stacked on the first surface;
a first electrode electrically connected with the first semiconductor layer;
a second electrode electrically connected with the second semiconductor layer;
a plurality of three-dimensional nano-structures located on at least one surface of the substrate, wherein the plurality of three-dimensional nano-structures is aligned side by side, and a cross section of each of the plurality of three-dimensional nano-structures is M-shaped.

* * * * *